(12) United States Patent
Gao

(10) Patent No.: US 11,716,834 B2
(45) Date of Patent: Aug. 1, 2023

(54) SYSTEMS AND METHODS FOR THERMAL MANAGEMENT OF A DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 52 days.

(21) Appl. No.: 16/264,374

(22) Filed: Jan. 31, 2019

(65) Prior Publication Data

US 2020/0253091 A1 Aug. 6, 2020

(51) Int. Cl.
*H05K 7/20* (2006.01)

(52) U.S. Cl.
CPC ..... *H05K 7/20836* (2013.01); *H05K 7/20745* (2013.01); *H05K 7/20827* (2013.01)

(58) Field of Classification Search
CPC ........ F24F 1/0087; F24F 1/037; F24F 12/006; F28F 2250/08; F25B 2339/047; H05K 7/20836; H05K 7/20745; H05K 7/20827
See application file for complete search history.

(56) References Cited

U.S. PATENT DOCUMENTS

| | | | | |
|---|---|---|---|---|
| 2016/0102875 A1* | 4/2016 | Reytblat | ................... | F28C 1/04 62/259.4 |
| 2016/0381826 A1* | 12/2016 | Barbato | ................... | F24F 11/77 62/91 |
| 2018/0224174 A1* | 8/2018 | Hollander | ............... | F25B 49/02 |
| 2018/0320934 A1* | 11/2018 | Clark | .................... | F25B 25/005 |

* cited by examiner

*Primary Examiner* — David J Teitelbaum
(74) *Attorney, Agent, or Firm* — Womble Bond Dickinson (US) LLP

(57) ABSTRACT

This disclosure is directed to, in one aspect, a thermal management system for a data center. The thermal management system can include an air to air heat exchanger operable in a dry mode and a wet mode. The thermal management system can also include a liquid to air heat exchanger. The liquid to air heat exchanger can have a coil that receives the cooling liquid, with the coil being positioned in communication with the air of the data center such that the cooling liquid can absorb heat therefrom. Still further, the thermal management system can include a direct expansion cooling loop with a condenser and an evaporator. The system further provides multiple combinational operating conditions among multiple cooling modes. Other aspects are described.

20 Claims, 5 Drawing Sheets

SYSTEMS AND METHODS FOR THERMAL MANAGEMENT OF A DATA CENTER

TECHNICAL FIELD

The present disclosure is directed to systems and methods for thermal management, and more particularly, thermal management systems and methods for data centers. Other aspects are also described.

BACKGROUND

Data centers used for housing computer systems and their associated components, such as for telecommunications, data storage, etc. have become more and more common. Cooling/thermal management systems for such data centers generally consume significant amounts of the energy, and thus, improving the energy efficiency of data center cooling is an important consideration, especially for hyperscale operators. Traditional cooling systems and cooling infrastructures for data centers usually consist of multiple cooling components, such as cooling towers, chillers, economizers, CRAH/CRAC, in-row coolers, etc., and thus generally are complex systems that can require large amounts of space/areas. Additionally, fast development and modular designs can be critical for modern data centers. Accordingly, it can be seen that a need exists for systems and methods for thermal management for data centers that help to improve energy efficiency, well as significantly improve reliability. The present disclosure addresses these and other related and unrelated issues.

SUMMARY

Briefly described, in one aspect, the present disclosure is directed to a thermal management system for a data center. The thermal management system can include an air to air heat exchanger, a liquid to air heat exchanger, and a direct expansion cooling loop.

The air to air heat exchanger is in communication with a data center airflow (e.g., including air directed or circulated to and from the data center, such as by one or more fans, blowers, or other suitable air movers), and is configured to operate in a dry mode and a wet mode. In the dry mode, exterior air is provided or directed through the air to air heat exchanger to absorb heat from and cool the data center air. In the wet mode, cooling liquid can be dispersed over the air to air heat exchanger to humidify the exterior air, e.g., to utilize the air wet bulb temperature to facilitate further cooling of the data center air.

The liquid to air heat exchanger also is in communication with the data center air. The liquid to air heat exchanger can include a coil through which a cooling liquid is circulated, e.g., the cooling liquid can be directed or provided to the coil and circulated or recirculated therethrough by a pump in communication with the coil and a basin storing the cooling liquid. The coil of liquid to air heat exchanger further is positioned to be in communication with the data center air, e.g., such that the data center air flow passes over the coil as it moves through the thermal management system, allowing the cooling liquid to absorb heat from the data center air. In one embodiment, the liquid to air heat exchanger can be positioned downstream of the air to air heat exchanger, and in one embodiment, the liquid to air heat exchanger can positioned upstream of the air to air heat exchanger.

The direct expansion cooling loop also is in communication with the data center air as it moves through the thermal management system. The direct expansion loop generally includes a condenser, an evaporator, and a compressor in fluid communication with each other. The condenser of the direct expansion cooling loop can be in fluid communication with (e.g., via one or more tubes, pipes, or other suitable fluid conduits) and receive the cooling liquid from the liquid to air heat exchanger. In one embodiment, the evaporator of the direct expansion loop is arranged to be parallel to the liquid to air heat exchanger (e.g., a coil of the evaporator can be arranged to be parallel to the coil of the liquid to air heat exchanger along the flow path of the data center air). In one embodiment, the thermal management system can include an air vent through which the data center air flow is directed, which air vent is configured to selectively provide prescribed amounts of the data center air to the liquid to air heat exchanger and the evaporator.

The air to air heat exchanger further can include an evaporative nozzle assembly having a plurality of evaporative nozzles for distributing or otherwise providing cooling liquid to or over the air to air heat exchanger in the wet mode (e.g., the evaporative nozzle assembly can introduce cooling liquid to the exterior air flow for humidifying the external air directed or otherwise passing through the air to air heat exchanger). In one embodiment, the evaporative nozzle assembly can be in fluid communication with the coil of the liquid to air heat exchanger for receiving the cooling liquid therefrom. In addition, or in alternative constructions, the thermal management system can include a bypass loop (e.g., including one or more tubes, pipes, or conduits or a network thereof) that is in fluid communication with the pump and basin, such that cooling liquid can be provided to the evaporative nozzle assembly directly from the basin.

In another aspect, the present disclosure is directed to a method for thermal management at a data center. The method can include providing or directing air (e.g. using one or more fans, blower, or other suitable air movers) of the data center to and through a thermal management system. The method further can include directing or providing the data center air to an air to air heat exchanger, which operates in dry and wet modes. The method further includes providing or directing the data center air to a liquid to air heat exchanger. In one embodiment, the data center air flow can be directed to the liquid to air heat exchanger after passing through the air to air heat exchanger, and in one embodiment, the data center air flow can be directed to the liquid to air heat exchanger prior to passing through the air to air heat exchanger. The method also can include passing the data center air flow over a coil of the liquid to air heat exchanger for absorbing heat of the data center air into a cooling liquid circulated through the coil. The method additionally includes providing or directing the data center air flow to an evaporator in a direct expansion cooling loop that includes including an evaporator and a condenser. Accordingly, systems and methods according to embodiments of the present disclosure can help to provide a simplified infrastructure, high reliability, fast deployment, reduced costs, as well as high operating efficiencies.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Figure 1:
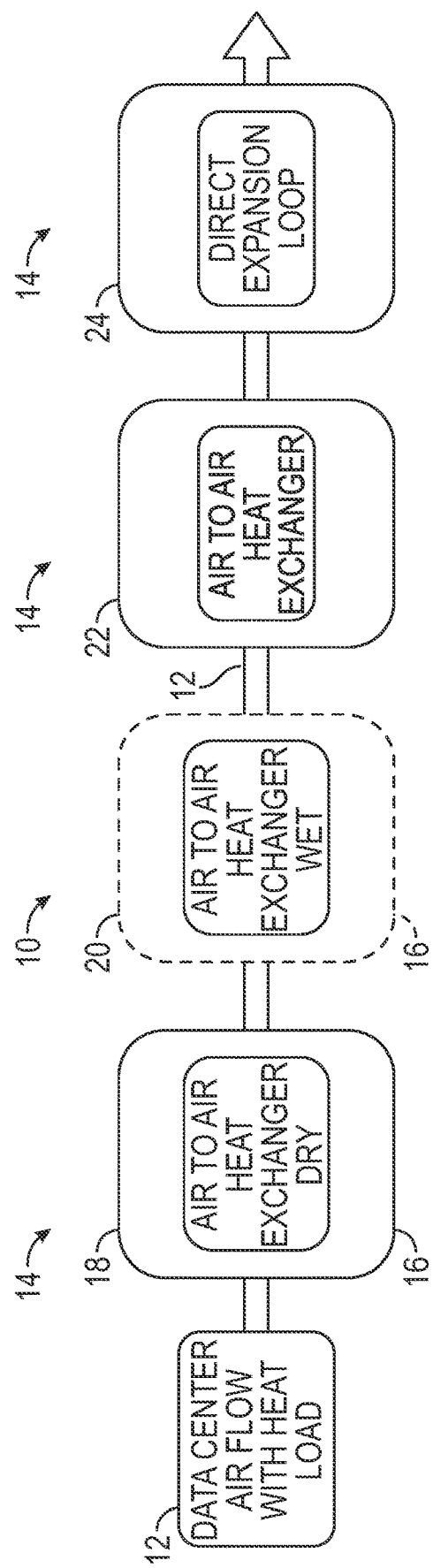
FIG. 1 shows a block diagram for thermal management according to one embodiment of the present disclosure.

FIG. 1 shows a block diagram for a thermal management system 10 for a data center, such as a data center for telecommunications, data storage, etc. or any suitable type of data center housing/storing information technology (IT) equipment (e.g., servers, power units, cables, etc.) according to principles of the present disclosure. As shown in FIG. 1, the thermal management system 10 is in communication with air or airflow 12 of the data center, and includes multiple thermal management stages 14 using various heat exchangers for facilitating different levels of cooling of the data center airflow 12, such that heat (e.g., heat originally generated by IT equipment) carried by the data center air 12 can be extracted to the ambient.

According to embodiments of the present disclosure, as shown in FIG. 1, the thermal management system 10 includes an air to air heat exchanger 16 that uses airflow (e.g., from air external to the data center) to cool the internal data center air 12. The air to air heat exchanger 16 can include a dry mode 18 and a wet mode 20. In the dry mode, only external airflow passes through the air to air heat exchanger 16, and in the wet mode, also known as an evaporative cooling mode, a cooling liquid, such as water or other suitable treated water or cooling liquid, is sprayed or otherwise dispersed over the air to air heat exchanger 14.

The thermal management system 10 further can include a liquid to air heat exchanger 22 that uses a cooling liquid, such as water or other suitable cooling liquid, to cool the internal data center air 12. Still further, the thermal management system 10 can include a direct expansion cooling loop 24, e.g., including an evaporator, a condenser, and a compressor. In one embodiment, the condenser can be an air-cooled condenser, though the condenser can be a water-cooled condenser, without departing from the scope of the present disclosure.

Figure 2:
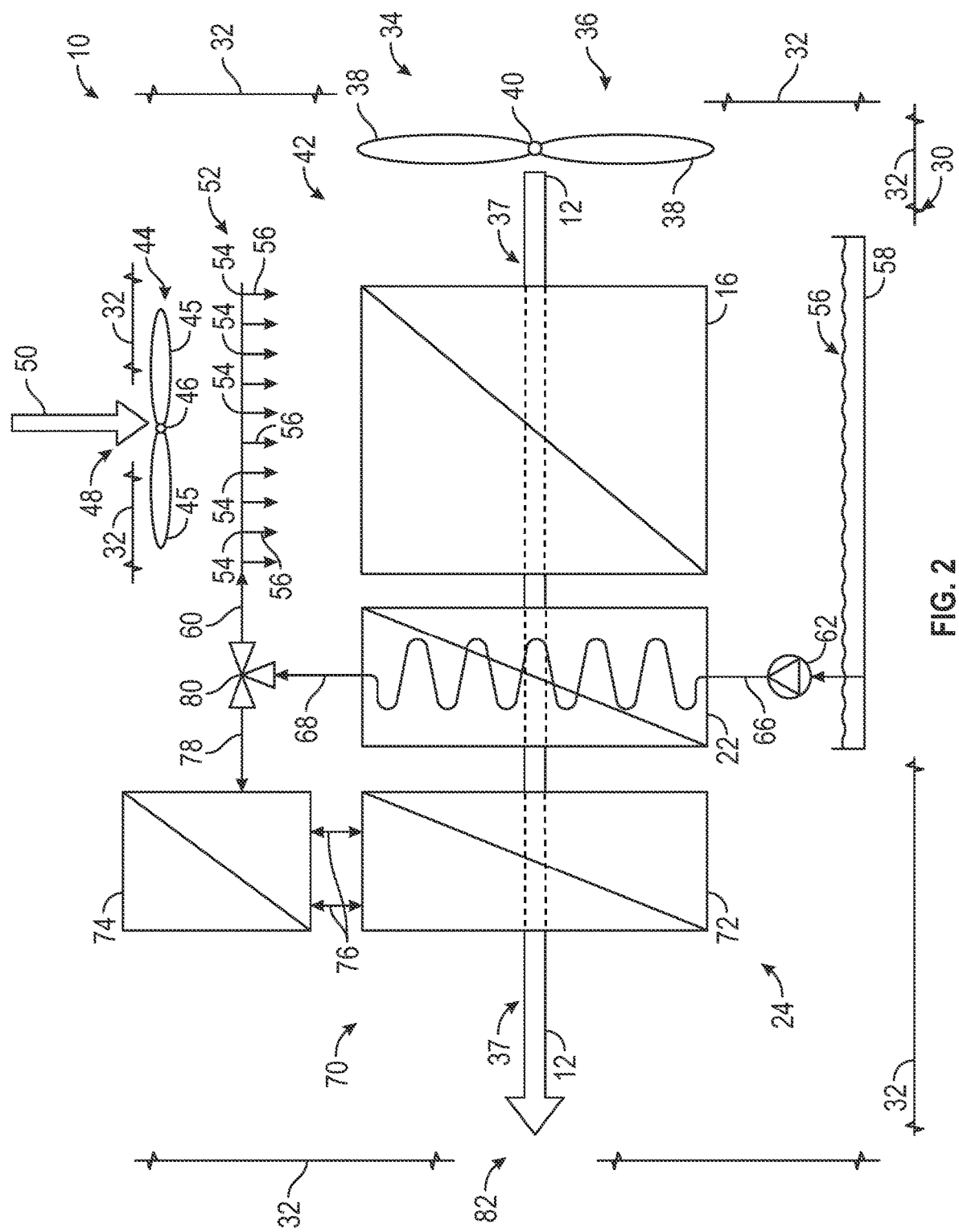
FIG. 2 shows a schematic diagram of a thermal management system including a liquid to air heat exchanger according to one embodiment of the present disclosure.

FIG. 2 shows a schematic diagram of a thermal management system 10 according to one embodiment of the present disclosure. As shown in FIG. 2, the thermal management system 10 can include an indirect evaporative cooling (IDEC) system or assembly with an air to air heat exchanger 16 and a direct expansion cooling loop 24. The thermal management system 10 also can include a liquid to air heat exchanger 22 added into the IDEC system. For example, in one embodiment, the thermal management system 10 can include an IDEC system that is produced to include the liquid to air heat exchanger 22, though in one embodiment an existing IDEC system can be modified or retrofitted to include a liquid to air heat exchanger 22, without departing form the scope of the present disclosure. By including or otherwise adding the liquid to air heat exchanger 22 to the IDEC thermal management system, the system is able to substantially maximize the use of cooling liquid, e.g., water or other any suitable cooling liquid, such as water including an additive (e.g., inhibitors, chemicals, etc. added to enhance long-term reliability), for the cooling of the data center air 12. In the existing IDEC systems/designs, cooling liquids generally are only used for humidifying the external air in the wet mode operation of an air to air heat exchanger, and by adding/including a liquid to air heat exchanger in a IDEC system/design, the cooling liquid can also be used for cooling, or further cooling, of the data center air 12 through the liquid to air heat exchanger 22.

FIG. 2 additionally shows that the thermal management system 10 can include a housing or casing 30, e.g., including a plurality of wall, portions, sections, etc., 32, that at least partially house or surround the components of the thermal management system 10, e.g., the air to air heat exchanger 16, the liquid to air heat exchanger 22, and the direct expansion cooling loop 24. The thermal management system 10 further is in communication with the data center air 12. In one embodiment, the thermal management system 10 can be placed along an exterior of the data center and can be in communication with the data center air 12 through vents, ducts, etc. or other suitable air passageways in communication with the data center air or airflows, though the thermal management system 10 can be internally integrated with the data center, e.g., the thermal management system 10 can be internally incorporated with a ventilation system or other suitable air passageways, air ducts, vents, etc. of the data center, without departing from the scope of the present disclosure.

As shown in FIG. 2, the thermal management system 10 also can include and intake 34, e.g., with one or more inlets, openings, etc. that are defined within a wall or portion 32 of the housing 30 and in communication with the data center air 12 (e.g., are in communication with one or more vents, ducts, etc. or other suitable air passageways in communication with the data center airflow 12). The thermal management system 10 further includes an air mover, such as a fan or blower 36 positioned along, adjacent, or proximate to and in communication with the inlet 34 and configured to pull, drive, or otherwise generate circulation of the data center air 12 from the data center into and through the thermal management system 10 to complete an internal airflow path 37 therethrough. Though the figures show a single fan 36, multiple fans can be used to draw/pull in the data center air 12, without departing from the scope of the present disclosure. In one embodiment, the fan 36 includes a rotary fan with a plurality of blades 38 mounted about a hub 40, though the fan can include other suitable fans, air movers, or air moving mechanisms, such as centrifugal fans, cross-flow fans, etc., without departing from the scope of the present disclosure.

FIG. 2 also generally shows that the air to air heat exchanger 16 can be positioned at or otherwise along an upstream portion or end 42 of the thermal management system 10, e.g., adjacent or proximate to the fan 36 or intake 34. The air to air heat exchanger 16 generally is operable in a dry mode and a wet mode. In the dry mode, only external air 50 passes through the air to air heat exchanger 16. For example, the air to air heat exchanger 16 can include one or more fans or blowers 44 (e.g., a fan 44 including a plurality of blades 45 connected to a hub 46) configured to direct or circulate external air 50 to and through the air to air heat exchanger 16, though any suitable fan, such as a cross-flow fan, a centrifugal fan, etc. or other suitable air mover or air moving mechanism, can be used without departing from the scope of the present disclosure. The fan(s) 44 can be positioned near, adjacent, or otherwise along and in communication with an intake 48 (e.g., including one or more openings or inlets defined in a wall or portion 32 of the dispenser housing 30), and the fan(s) 44 are configured to pull, drive, or otherwise circulate exterior air 50 through the intake 48 and the air to air heat exchanger 16. For example, exterior air 50 (e.g., ambient air) can be passed through the air to air heat exchanger 16 and can absorb heat from the data center air 12 passing as it also passed through the air to air heat exchanger 16 to facilitate cooling of the data center air 12.

In one embodiment, the air to air heat exchanger 16 can have one or more air conduits, ducts, etc. or other suitable airflow paths through which the exterior air 50 is directed, moved, or otherwise circulated, and one or more air conduits or airflow paths through which the data center air 12 is directed, moved, circulated, etc. The conduits/airflow paths for the external 50 and data center 12 air can be in thermal communication with each other to facilitate cooling of the data center air 12, e.g., such that heat from the data center air 12 can be absorbed or otherwise transferred to the exterior air 50 and thereafter to the ambient. The conduits/airflow paths further may be configured such that the exterior airflow 50 and the data center airflow 12 do not mix or otherwise directly interact to minimize, reduce, or prevent contamination of the data center airflow 12. That is, the external air 50 (e.g., ambient air) and the internal data center air 12 can be fully segregated, such that particulates, particles, or other contaminants present in the exterior air 50 do not contaminate, or are otherwise not introduced into, the data center air 12 or the data center, itself.

In the wet mode, which is also referred to as an evaporative cooling mode, a cooling liquid, such as water or other suitable cooling liquid, can be sprayed or otherwise dispersed over/across the air to air heat exchanger 16. For example, the air to air heat exchanger 16 can include an evaporative nozzle assembly 52 with a plurality of evaporative nozzles or injectors 54 provided therealong and configured to distribute a cooling liquid 56 over the air to air heat exchanger 16. For example, the evaporative nozzles 54 are configured to inject or otherwise direct the cooling liquid 56 into the exterior air 50 for humidifying and increasing the cooling capacity of the exterior air 50 under certain conditions. The evaporative nozzle assembly 52 further can be in communication with a cooling liquid basin or supply 58, e.g., via one or more tubes, pipes, or other suitable conducts providing fluid flow paths 60 in communication therewith. The thermal management system 10 further can include a fluid pump 62 in communication with the conduit(s) 60 for providing the cooling liquid to the conduit/rail 52 from the basin 58.

FIG. 2 additionally shows that the evaporator nozzle assembly 52 is positioned substantially adjacent or proximate to the fan 44. In general, the evaporator nozzle assembly 52 is designed or otherwise configured to direct the cooling liquid 56 toward the air to air heat exchanger 16, e.g., the evaporator nozzle assembly 52 sprays cooling liquid 56 in the direction of or over the heat exchangers. As further shown in FIG. 2, the cooling liquid 56 is dispersed in a manner that is generally parallel to flow direction of the exterior air 50; however, in some embodiments, the flow direction of the cooling air 50 can be adjusted, such that the flow of exterior air 50 is directed in manner that is counter or transverse to the flow of cooling liquid 56 e.g., the exterior air 50 can be designed to flow in the opposite direction or passed across the cooling liquid 56. In one example embodiment, the driving direction of the fan 44 can be reversed or otherwise altered such that the exterior air flow 50 is driven in the opposite direction, e.g., such that the exterior air flow 50 exits, rather than enters, the intake 48. In addition, or in the alternative, the position or orientation of the evaporator nozzle assembly 52 can be altered to disperse the cooling liquid 56 in a direction that is traverse or counter to the exterior air flow 50.

Although the evaporator nozzle assembly 52 generally is shown to be positioned substantially adjacent or proximate to the fan 44 in the Figures of the present application, in alternative constructions, the evaporator nozzle assembly 52 can be positioned along on an opposing side of the air to air heat exchanger 16 in relation to the fan 44. Furthermore, in embodiments in which the evaporator nozzle assembly 52 on an opposing side of the air to air heat exchanger 16 relative to the fan 44, the evaporator nozzle assembly 52 generally is designed or otherwise configured to spray the cooling liquid 56 towards the air to air heat exchanger 16. The evaporator nozzle assembly 52, fan 44, and intake 48 can be positioned in along suitable side of the air to air heat exchanger 16, such as along a top, bottom, left, right, front, back, etc. side or portion thereof, or in any suitable orientation, configuration, etc., without departing from the scope of the present disclosure. However, the cooling liquid 56 generally is sprayed towards the air to air heat exchanger 16, independent of the location of the evaporator nozzle assembly 62, while the external air 50 can be directed either in the same or opposite directions as the cooling fluid 56.

In one embodiment, the liquid to liquid heat exchanger 22 is located after or downstream of the air to air heat exchanger 16 as shown in FIG. 2. The liquid to air heat exchanger 22 generally is configured to use a cooling liquid, such as water or other suitable cooling liquid, to absorb heat from and cool the data center air 12. For example, the liquid to air heat exchanger 22 can have a coil 64 including one or more conduits, tubes, pipes, etc. or a network thereof through which the cooling liquid 56 is directed, circulated, or otherwise flows. The coil 64 further is in communication with the data center air 12 as it is directed or otherwise passes through the liquid to air heat exchanger 22 (e.g., passes through vents, ducts, etc. or other suitable airflow passageways thereof) for facilitating cooling the data center air 12. That is, the cooling liquid 56 can at least partially absorb heat from the data center air 12 as it is passed or otherwise directed over the coil 64.

In one embodiment, the coil 64 is in communication with the basin 58 (e.g., through one or more tubes, pipes, conduits or other fluid flow paths 66) for receiving the cooling liquid 56 therefrom. For example, the cooling liquid 56 can be pumped from the basin 58 to the liquid to air heat exchanger 22, e.g., by the pump 62. More specifically, the liquid to air heat exchanger 22 includes one or more tubes, pipes, conduits, or other suitable fluid flow paths 66 in fluid communication with the coil 64 and the pump 62 such that the cooling liquid 56 can be pumped to and directed through the coil 64 from the basin 58. Cooling liquid can be provided to the liquid to air heat exchanger 22 from any suitable source, however, without departing from the scope of the present disclosure.

In addition, in one embodiment, the liquid to air heat exchanger 22 can include one or more tubes, pipes, conduits or other suitable fluid flow paths 68 in communication with the evaporative nozzle assembly 52 of the air to air heat exchanger 16 for providing cooling liquid thereto from the liquid to air heat exchanger 22. For example, the conduit 68 can be in communication with the coil 64 of the liquid to air heat exchanger 22 and the nozzles 54 of the evaporative nozzle assembly 52.

FIG. 2 further shows that the direct expansion cooling loop 24 can be provided at a position downstream of the liquid to air heat exchanger 22 (e.g., at a downstream end 70 of the thermal management system 10). The direct expansion cooling loop 24 includes an evaporator 72 and a condenser 74. The evaporator 72 is generally located to be in communication with the data center air 12 as it flows or is directed through the thermal management system 10. For example, the condenser 74 is positioned to be generally adjacent to the evaporator 72 and is in fluid communication therewith via tubes, pipes, conduits, or other suitable fluid flow paths 76. The direct expansion cooling loop 24 further includes a compressor (not shown) that is provided along or otherwise in communication with a fluid flow path 76.

Furthermore, the evaporator 72 can include a coil or networks of coils (not shown) that receive a cooling liquid, such as water or other suitable cooling liquid or coolant. The evaporator 72 further is in communication with the data center air 12 as it moves through the thermal management system 10, e.g., such that heat from the data center air 12 can be at least partially absorbed by the cooling liquid passing through the coil of the evaporator 72. The cooling liquid passing through the coil of the evaporator 72 further can be passed, circulated, or otherwise directed to the condenser 74 (e.g., to a coil or networks of coils thereof) such that the heat absorbed by the cooling liquid can be transferred to the ambient. The condenser 74 is water-cooled, though the condenser 74 can be an air-cooled, without departing from the scope of the present disclosure. In one embodiment, the cooling liquid 56 is provided to the condenser 74 from the basin 58, e.g., in the case a water cooled condenser is used. For example, the direct expansion cooling loop 24 can include one or more tubes, pipes, conduits or other suitable fluid flow paths 78 that are in communication with the coil 64 of the liquid to air heat exchanger 22, e.g., via conduit 68. The condenser 74 can receive cooling liquids from any suitable source, however, without departing from the scope of the present disclosure.

Accordingly, the cooling liquid 56 can be used in several ways, e.g., for evaporative cooling in the wet mode of the air to air heat exchanger 16, as a cooling medium for the liquid to air heat exchanger 22, with the condenser 74, etc. such that usage of cooling liquid can be maximized, especially when its temperature is relatively low. For example, as shown in FIG. 2, after the cooling liquid 56 passes through and exits the coil 64 of the liquid to air heat exchanger 22, it can be used for either evaporative cooling of the air to air heat exchanger 16 for the wet cooling mode or in the condenser 74 or both. In one embodiment, the thermal management system 10 includes one or more valves 80 configured to selectively direct the cooling liquid 56 from the liquid to air heat exchanger 22 to the evaporative nozzle assembly 52 and/or the condenser 74, e.g., the cooling liquid 56 can be selectively directed to the evaporative nozzle assembly 52 or the condenser 74 based on ambient conditions (e.g., humidity, temperature, etc.) outside the data center, conditions (e.g., humidity, temperature, etc.) inside the data center or of the data center air, conditions (e.g., temperature, pressure, etc.) of the cooling liquid, etc. or any suitable cooling requirement. The evaporative nozzle assembly 52, liquid to air heat exchanger 22, and condenser 74 all can receive the cooling fluid 56 from the basin 58. However, in addition, or in alternative constructions, the evaporative nozzle assembly 52, liquid to air heat exchanger 22, or condenser 74, can each receive cooling fluid, coolant, water, etc. from any other suitable source, without departing from the scope of the present disclosure.

After the data center air 12 is directed or passes through the thermal management system 10 and at least a portion of its heat is absorbed by the air to air heat exchanger 16, e.g., either in the dry or wet mode, the liquid to air heat exchanger 22, or the direct expansion cooling loop 24, the data center air 12 can be directed back to or otherwise circulated or recirculated through the data center, e.g., through an output 82 in communication with one or more vents, air passages, air valve, damper, etc. in communication with the data center.

In operation, the thermal management system 10 can selectively activate or deactivate the air to air heat exchanger 16, e.g., the dry mode and the wet mode, the liquid to air heat exchanger 22, and the direct expansion cooling loop 24, based on a ambient conditions (e.g., temperature, humidity, etc. outside the data center), conditions (e.g., temperature, humidity, etc.) of the data center air 12, or conditions (e.g., temperature, pressure, etc.) of the cooling fluid 56, e.g., as determined by one or more sensors of the thermal management system 10 configured to capture information related to or indicative of specific conditions. For example, under certain conditions, the air to air heat exchanger 16 will operate in the dry mode only, with the pump 62 deactivated or turned off, and in other conditions, the pump 62 can be activated to circulate the cooling fluid 56 through the liquid to air heat exchanger 22 to facilitate cooling of the data center air therewith, and further to provide the cooling fluid 56 to the evaporator nozzle assembly 52 to activate the wet mode of the air to air heat exchanger 16. With embodiments of the present disclosure, control of the thermal management system 10 and various components thereof may be used to adjust the thermal management system 10 to attempt to achieve, optimize, maximize, etc. energy efficiency or reliability of operation.

Figure 3:
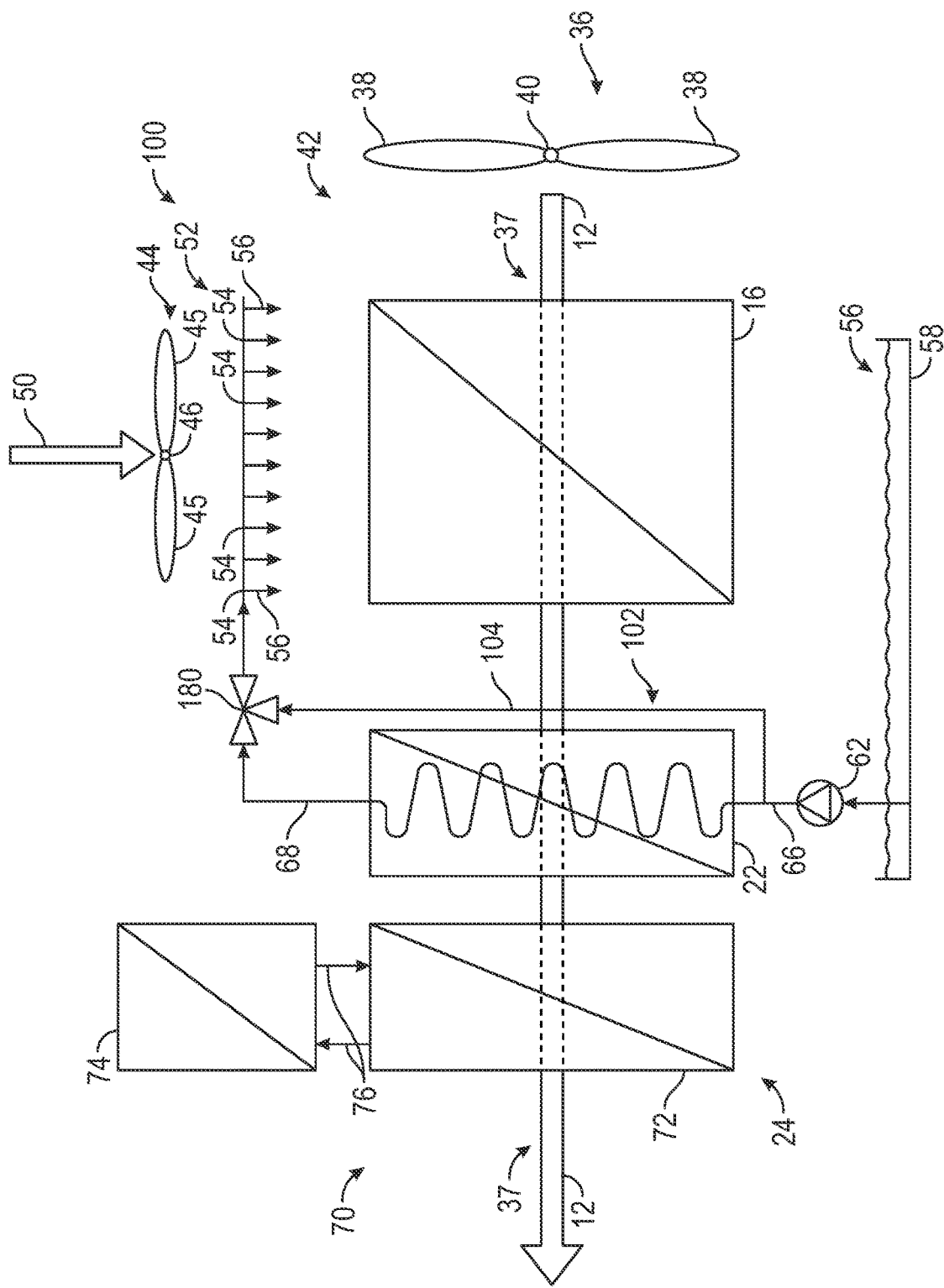
FIG. 3 shows a schematic diagram of a thermal management system including a liquid to air heat exchanger with bypass loop according to one embodiment of the present disclosure.

FIG. 3 shows a schematic diagram of a thermal management system 100 according to one embodiment. As shown in FIG. 3, the thermal management system 100 can include a bypass loop 102 to direct cooling liquid 56 from the basin 58 to the evaporative nozzle assembly 52. The bypass loop 102 includes one or more tubes, pipes, conduits, or other suitable fluid flow paths 104 in communication with the pump 62 and evaporative nozzle assembly 52, e.g., the conduit(s) 104 can by-pass the liquid to air heat exchanger 22 to direct the cooling liquid 56 directly to the evaporative nozzle assembly 52. For example, the bypass loop 102 can be used to transport the cooling liquid 56 from the basin 58 to the evaporative nozzle assembly 52 directly when a temperature of the cooling liquid 56 passing through the liquid to air heat exchanger 22 is not appropriate, e.g., is too hot, for use in the wet mode of the air to air heat exchanger 16, and in this scenario, the liquid to air heat exchanger 22 is bypassed.

In one embodiment, as shown in FIG. 3, the conduit 104 is in fluid communication with a valve 180, which also is in fluid communication with the coil 64 of the liquid to air heat exchanger 22 (e.g., via conduit 68). The valve 180 is configured to selectively direct or provide the cooling liquid 56 to the evaporator nozzle assembly 52 from the liquid to air heat exchanger 22 or from the by-pass loop 102 (e.g., through the by-pass loop 102 directly from the basin 58 without passing through the liquid to air heat exchanger 22). The thermal management system 100 additionally can include one or more sensors, e.g., one or more temperature sensors (not shown) configured to capture information related to a temperature of the cooling liquid in or passing through the coil 64 of the liquid to air heat exchanger 22. When the temperature of the cooling liquid in or passing through the liquid to air heat exchanger 22 is at or below a predetermined temperature value, the valve 180 can be configured to direct the cooling fluid from the liquid to air heat exchanger 22 to the evaporator nozzle assembly 52, e.g., for using the cooling fluid passing through the coil 64 of the liquid to air heat exchanger 22 in the wet mode of the air to air heat exchanger 16. And, when the temperature of the cooling liquid in or passing through the liquid to air heat exchanger 22 is at or above a predetermined temperature value, the valve 180 can be configured to direct the cooling fluid from the by-pass loop 102 to the evaporator nozzle assembly 52, e.g., for by-passing the liquid to air heat exchanger 22 and using cooling liquid directly from the basin 58 in the wet mode of the air to air heat exchanger 16. The valve 180 further can be configured to direct the cooling liquid from the liquid to air heat exchanger 22 and the by-pass loop at certain temperatures, without departing from the scope of the present disclosure.

The bypass loop 102 according can be used to adjust the cooling liquid passing through the liquid to air heat exchanger 22 and evaporative nozzle assembly 52, e.g., based on the cooling requirement, cooling liquid temperature, etc. to help to achieve energy efficiency, as well as high reliability of operation. In one scenario, the cooling fluid only passes through the coil 64 of the liquid to air heat exchanger 22, which means the thermal management system 100 uses dry air to air cooling with the air to air heat exchanger 16 in the dry mode, as well as liquid to air cooling with the liquid to air heat exchanger 22. In another scenario, the cooling fluid only passes through the evaporative nozzle assembly 52, which means the thermal management system 100 uses wet bulb cooling only, i.e., only the air to air heat exchanger 16 is operating in its wet mode. In a further scenario, the cooling fluid passes through both the coil 64 of the liquid to air heat exchanger 22 and the evaporative nozzle assembly 52, which means the thermal management system 100 uses wet bulb cooling with the air to air heat exchanger 16 in the wet mode, as well as liquid to air cooling with the liquid to air heat exchanger 22. Furthermore, in some embodiments, a flow rate of the cooling fluid can be adjusted or maintained (e.g., by activating, deactivating, or altering the speed of the pump 62 or using valves or other suitable mechanism along the cooling fluid flow path) to help to maximize, optimize, or otherwise achieve a threshold energy efficiency or reliability.

Figure 4:
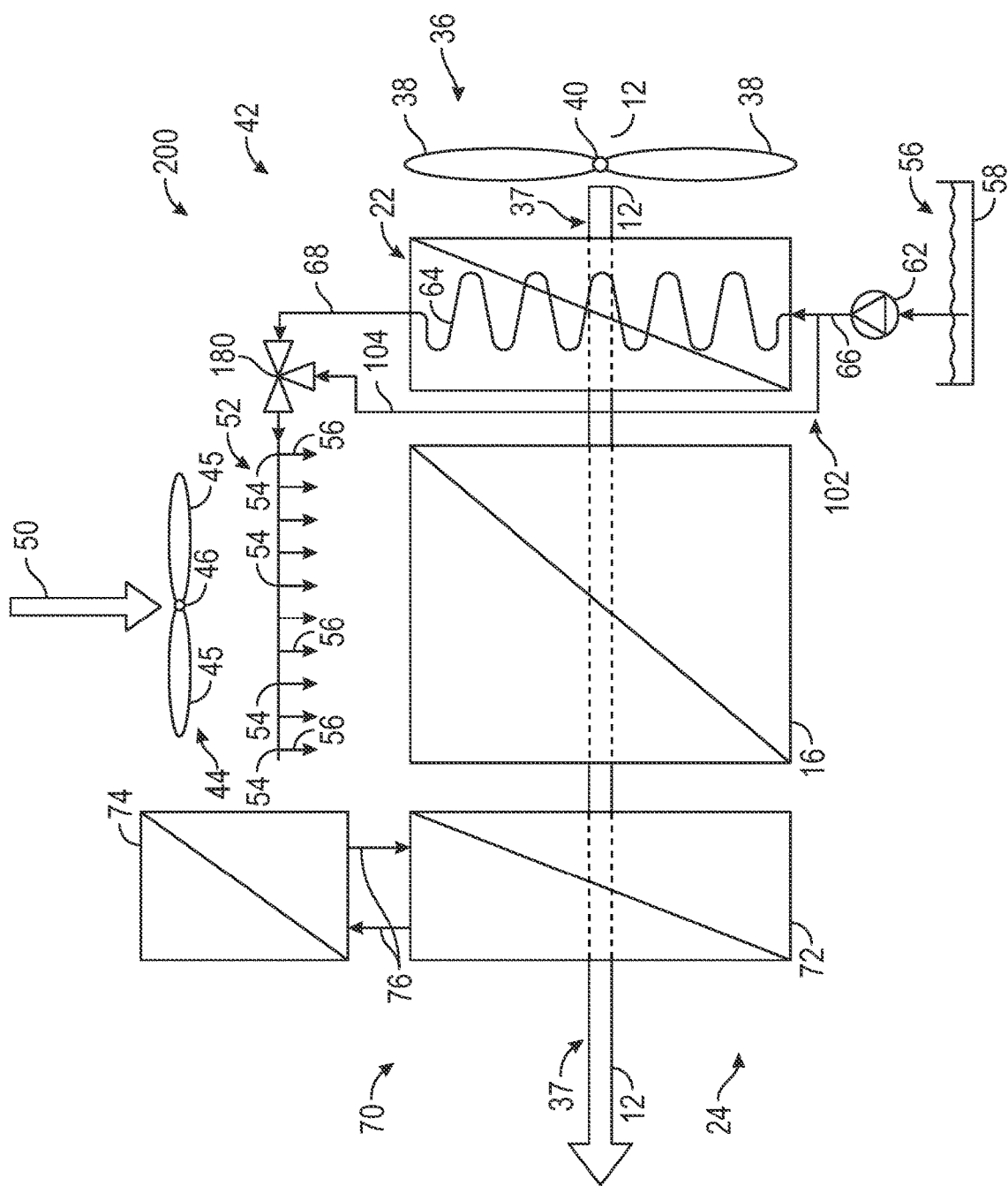
FIG. 4 shows a schematic diagram of a thermal management system including a liquid to air heat exchanger according to one embodiment of the present disclosure.

FIG. 4 shows a schematic diagram of a thermal management system 200 according to one embodiment. The thermal management system 200 includes a liquid to air heat exchanger 22 and a bypass loop 102. FIG. 4 further shows that, with the thermal management system 200, the liquid to air heat exchanger 22 is located before or upstream of the air to air heat exchanger 16 (e.g., at position adjacent or proximate an upstream end 42 of the thermal management system 200), such that the data center air 12 is cooled by the liquid to air heat exchanger 22 and then the air to air heat exchanger 16. The bypass loop 102 is also used in the thermal management system 200 for the similar purpose as described above.

Figure 5:
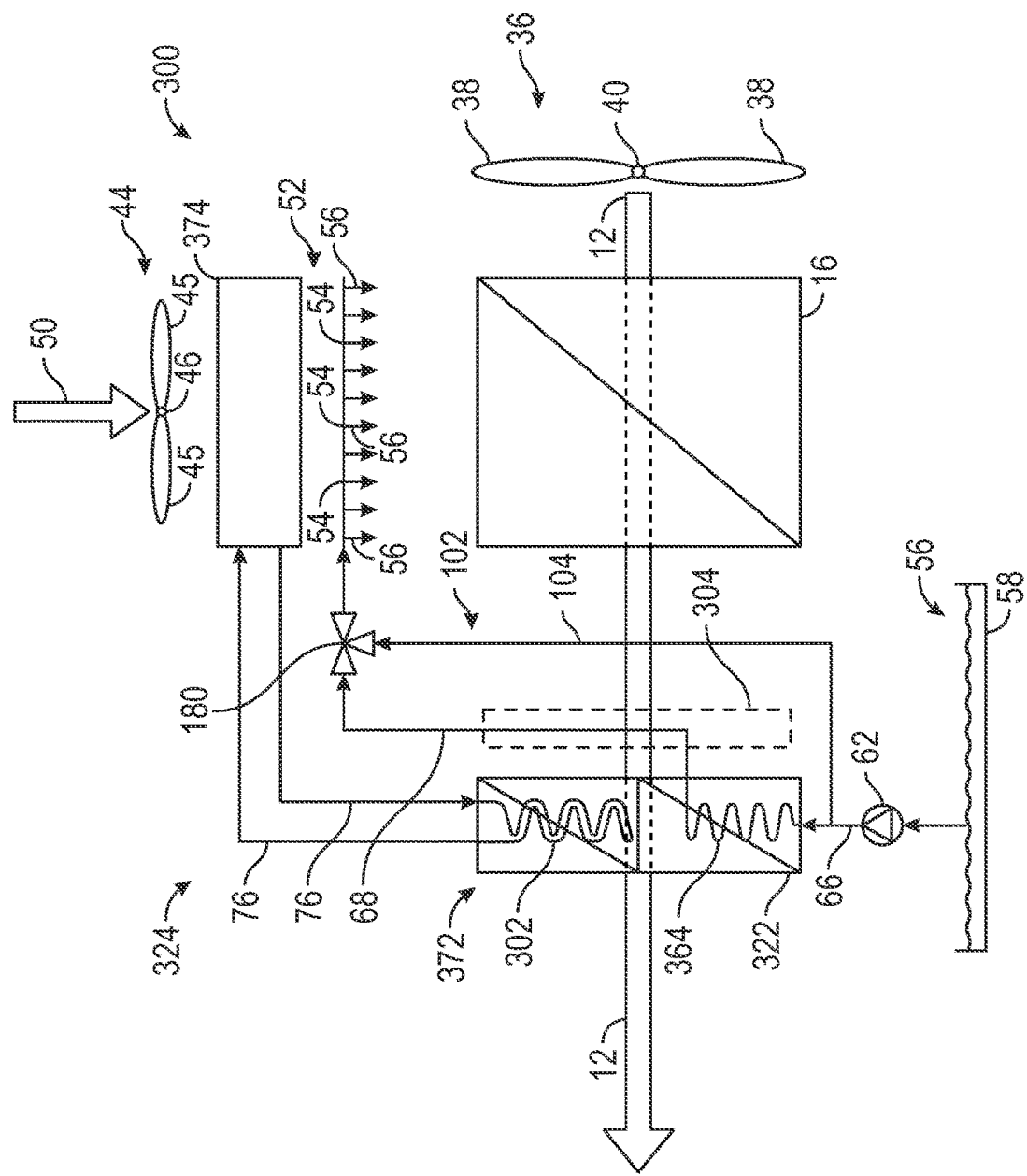
FIG. 5 shows a schematic diagram of a thermal management system including a liquid to air heat exchanger and an evaporator arranged in parallel according to one embodiment of the present disclosure.

FIG. 5 shows a schematic diagram of a thermal management system 300 according to one embodiment. As shown in FIG. 5, the thermal management system 300 can include an air to air heat exchanger 16 arranged at an upstream location 42 of the thermal management system 300. The thermal management 300 also can include a liquid to air heat exchanger 322 that is arranged adjacent or parallel to an evaporator 372 of a direct expansion loop 324, e.g., at a position/location downstream of the air to air heat exchanger 16. For example, the coil 364 of the liquid to air heat exchanger 322 and a coil 302 of the evaporator 372 are arranged or positioned in a parallel manner, as shown in FIG. 5. Accordingly, when the air to air heat exchanger 16 is not able to provide sufficient cooling capacity (e.g., in its dry mode or its wet mode), the liquid to air heat exchanger 322, as well as the direct expansion cooling loop 324 can be used for additional cooling. The condenser 374 of the direct expansion loop 324 can be arranged adjacent or next to the air to air heat exchanger 16. In one embodiment, as shown in FIG. 5, the condenser 374 can be positioned to be in communication with the exterior air 50 provided to the air to air heat exchanger 16, e.g., to facilitate air cooling of the condenser 374. In an alternative construction, however, the external air 50 flow intake can be positioned along the opposing side of the air to air heat exchanger 16 in relation to the condenser 374, such that the external air 50 passes through the air to air heat exchanger 16 and then the condenser 374.

In addition, the thermal management system 300 has an air valve 304 that can be positioned in front of the two coils 302/364 for directing/blocking flow of the data center air 12 thereto. For example, the air valve 304 can include a portion (or portions) that is movable or reconfigurable between a plurality of positions or orientations to selectively direct or otherwise provide prescribed amounts, e.g., certain percentages, of the data center air 12 to the liquid to air heat exchanger 322 and to the evaporator 372, e.g., based on ambient conditions or conditions of the data center air 12 or cooling liquid 56. The coil 364 of the liquid to air heat exchanger 322 and a coil 302 of the evaporator 372 can provide different cooling capacities under different conditions. Accordingly, under certain ambient conditions (e.g., temperature, humidity, etc. outside the data center), conditions (e.g., temperature, humidity, etc.) of the data center air, or conditions (e.g., temperature, pressure, etc.) of the cooling liquid, such as conditions below, at, or above predefined thresholds, the movable portion of the air vent can be moved between its various positions to change/alter the percentages of data center air 12 directed to the liquid to air heat exchanger 322 and the evaporator 372, e.g., a first amount is provided to the liquid to air heat exchanger 322 and a second amount is provided to the evaporator 372, which first and second amounts will be different or the same based on determined conditions. In one example, under certain ambient conditions or operation conditions, the direct expansion cooling loop 324 can be eliminated (e.g., the air valve can be positioned such that first amount is at about 100% and the second amount is at about 0%, with substantially all of the data center air 12 being directed through the liquid to air heat exchanger 322).

Embodiments of the present disclosure also are directed to a method for thermal management of, e.g., cooling of, data center air. The method can include providing or directing air 12 (e.g. using one or more fans 36) of a data center to and through a thermal management system, e.g., systems 10, 100, 200, 300. The method further can include directing or providing the data center air flow 12 to an air to air heat exchanger 16, which operates in dry and wet modes as described above. The method further includes providing or directing the data center air 12 to a liquid to air heat exchanger 22/322. In one embodiment, the data center air flow 12 can be provided/directed to the liquid to air heat exchanger 22/322 after passing through the air to air heat exchanger 16, and in one embodiment, the data center air flow 12 can be provided to the liquid to air heat exchanger 22 prior to passing through the air to air heat exchanger 16. The method also can include passing the data center air flow 12 over a coil 64 or networks of coils of the liquid to air heat exchanger 22/322 for absorbing heat of the data center air 12 into a cooling liquid circulated therethrough to facilitate cooling of the data center air 12. The method additionally includes providing or directing the data center air flow 12 to a direct expansion cooling loop 24, 324 that includes including an evaporator 72, 372 and a condenser 74, 374. A bypass loop 102 as described further can be used for improved system optimization and fluid management.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A thermal management system for cooling air of a data center, comprising:
    one or more fans configured to direct the air of the data center through the thermal management system;
    an air to air heat exchanger in communication with the air of the data center, the air to air heat exchanger being configured to operate in a dry mode in which only exterior air is used to facilitate cooling the air of the data center without a cooling liquid being dispersed, and a wet mode in which the cooling liquid is dispersed over the air to air heat exchanger to humidify the exterior air to facilitate cooling the air of the data center;
    a liquid to air heat exchanger in communication with the air of the data center, the liquid to air heat exchanger including a coil that receives the cooling liquid, and is positioned to be in communication with the air of the data center such that the cooling liquid at least partially absorbs heat therefrom to facilitate cooling of the air of the data center, wherein the coil includes one or more conduits, tubes, pipes, or a network thereof through which the cooling liquid flows, and wherein the liquid to air heat exchanger further includes a conduit in communication with the coil and an evaporative nozzle assembly of the air to air heat exchanger for providing cooling liquid thereto from the liquid to air heat exchanger;
    a pump in communication with the coil of the of the liquid to air heat exchanger, the pump being configured to provide the cooling liquid from a cooling liquid basin to the coil of the liquid to air heat exchanger;
    a direct expansion cooling loop in communication with the air of the data center, the direct expansion cooling loop including a condenser, and an evaporator in fluid commination with the condenser; and
    one or more valves configured to selectively direct the cooling liquid from the liquid to air heat exchanger to at least one of the evaporative nozzle assembly or the condenser based on ambient conditions outside the data center, conditions inside the data center, or conditions of the cooling liquid.

2. The thermal management system of claim 1, wherein the liquid to air heat exchanger is downstream of the air to air heat exchanger.

3. The thermal management system of claim 1, wherein the liquid to air heat exchanger is upstream of the air to air heat exchanger.

4. The thermal management system of claim 1, wherein the air to air heat exchanger includes a fan, the fan being configured to direct external air through the air to air heat exchanger to facilitate cooling of the air of the data center.

5. The thermal management system of claim 4, wherein the air to air heat exchanger further includes the evaporative nozzle assembly with a plurality of nozzles for dispensing the cooling liquid over the air to air heat exchanger to humidify the exterior air in the wet mode, wherein the evaporative nozzle assembly is in communication with the coil of the liquid to air heat exchanger for receiving the cooling liquid therefrom.

6. The thermal management system of claim 5, further comprising a bypass loop configured to provide the cooling liquid directly from the cooling liquid basin to the evaporative nozzle assembly.

7. The thermal management system of claim 1, wherein the condenser of the direct expansion cooling loop is in communication with and receives the cooling liquid from the liquid to air heat exchanger.

8. The thermal management system of claim 1, wherein the evaporator of the direct expansion loop is arranged in parallel with the liquid to air heat exchanger.

9. The thermal management system of claim 1, wherein the cooling liquid includes water.

10. A thermal management system for a data center, comprising:
    an air to air heat exchanger in communication with air of the data center, the air to air heat exchanger being configured to operate in a dry mode in which only exterior air is used to cool the air of the data center without a cooling liquid being dispersed, and in a wet mode in which the cooling liquid is dispersed over the air to air heat exchanger to facilitate cooling of the air of the data center; and
    a liquid to air heat exchanger in communication with the air of the data center, the liquid to air heat exchanger including a coil that receives the cooling liquid, and is positioned to be in communication with the air of the data center such that the cooling liquid at least partially absorbs heat from the air of the data center to facilitate cooling thereof, wherein the coil includes one or more conduits, tubes, pipes, or a network thereof through which the cooling liquid flows, and wherein the liquid to air heat exchanger further includes a conduit in communication with the coil and an evaporative nozzle assembly of the air to air heat exchanger for providing cooling liquid thereto from the liquid to air heat exchanger; and one or more valves configured to selectively direct the cooling liquid from the liquid to air heat exchanger to at least one of the evaporative nozzle assembly or a condenser based on ambient conditions outside the data center, conditions inside the data center, or conditions of the cooling liquid.

11. The thermal management system of claim 10, further comprising:

a direct expansion cooling loop in communication with the air of the data center, the direct expansion loop including the condenser and an evaporator.

12. The thermal management system of claim 10, wherein the liquid to air heat exchanger is downstream of the air to air heat exchanger.

13. The thermal management system of claim 10, wherein the liquid to air heat exchanger is upstream of the air to air heat exchanger.

14. The thermal management system of claim 10, further comprising:

a cooling liquid basin for storing the cooling liquid; and
a pump configured to provide the cooling liquid from the cooling liquid basin to the coil of the liquid to air heat exchanger.

15. The thermal management system of claim 14, wherein the air to air heat exchanger further includes the evaporative nozzle assembly with a plurality of nozzles for dispensing the cooling liquid over the air to air heat exchanger to humidify the exterior air in the wet mode, wherein the evaporative nozzle assembly is in communication with the coil of the liquid to air heat exchanger for receiving the cooling liquid therefrom.

16. The thermal management system of claim 15, further comprising a bypass loop configured to provide cooling liquid directly from the cooling liquid basin to the evaporative nozzle assembly.

17. The thermal management system of claim 11, wherein the condenser of the direct expansion cooling loop is in communication with and receives the cooling liquid from the liquid to air heat exchanger.

18. The thermal management system of claim 11, wherein the evaporator of the direct expansion loop is arranged in parallel with the liquid to air heat exchanger.

19. The thermal management system of claim 10, wherein the cooling liquid includes water.

20. A method for thermal management at a data center, comprising:

directing air of the data center to an air to air heat exchanger, wherein the air to air heat exchanger being configured to operate in a dry mode in which only exterior air is used to facilitate cooling the air of the data center without a cooling liquid being dispersed, and a wet mode in which the cooling liquid is dispersed over the air to air heat exchanger to humidify the exterior air to facilitate cooling the air of the data center;

directing the air of the data center to a liquid to air heat exchanger, wherein the liquid to air heat exchanger includes a coil that receives the cooling liquid, and is positioned to be in communication with the air of the data center such that the cooling liquid at least partially absorbs heat therefrom to facilitate cooling of the air of the data center, wherein the coil includes one or more conduits, tubes, pipes, or a network thereof through which the cooling liquid flows, and wherein the liquid to air heat exchanger further includes a conduit in communication with the coil and an evaporative nozzle assembly of the air to air heat exchanger for providing cooling liquid thereto from the liquid to air heat exchanger;

circulating a cooling fluid, using a pump, through a coil of the liquid to air heat exchanger to absorb heat from the air of the data center with the cooling fluid;

directing the air of the data center to a direct expansion cooling loop including an evaporator and a condenser; and selectively directing the cooling liquid from the liquid to air heat exchanger to at least one of the evaporative nozzle assembly or the condenser based on ambient conditions outside the data center, conditions inside the data center, or conditions of the cooling liquid.

* * * * *